(12) United States Patent
Cho et al.

(10) Patent No.: US 8,790,958 B2
(45) Date of Patent: Jul. 29, 2014

(54) QUANTUM DOT ORGANIC LIGHT EMITTING DEVICE AND METHOD OF FABRICATING THE SAME

(75) Inventors: Sung-Hwan Cho, Yongin (KR); Hyo-Seok Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 524 days.

(21) Appl. No.: 13/037,009

(22) Filed: Feb. 28, 2011

(65) Prior Publication Data
US 2011/0220869 A1    Sep. 15, 2011

(30) Foreign Application Priority Data
Mar. 9, 2010    (KR) .................. 10-2010-0021013

(51) Int. Cl.
*H01L 51/40* (2006.01)
(52) U.S. Cl.
USPC ............ 438/99; 438/22; 438/82; 977/893; 977/949
(58) Field of Classification Search
USPC ........ 438/22, 82, 99; 977/855, 858, 893, 932, 977/949, 952; 257/E21.007
See application file for complete search history.

(56) References Cited

U.S. PATENT DOCUMENTS

| 7,564,067 | B2 | 7/2009 | Cok |
| 7,615,800 | B2 | 11/2009 | Kahen |
| 7,710,026 | B2 | 5/2010 | Cok et al. |
| 2003/0222048 | A1 | 12/2003 | Asakawa et al. |
| 2006/0170331 | A1 | 8/2006 | Bertram et al. |
| 2007/0077594 | A1 | 4/2007 | Hikmet et al. |
| 2007/0080107 | A1 | 4/2007 | Yang et al. |
| 2007/0138460 | A1 | 6/2007 | Choi et al. |
| 2007/0194694 | A1 | 8/2007 | Reddy |
| 2007/0215856 | A1 | 9/2007 | Kwon et al. |
| 2008/0001538 | A1 | 1/2008 | Cok |

(Continued)

FOREIGN PATENT DOCUMENTS

| JP | 2001151834 A | 6/2001 |
| JP | 2002287377 A | 10/2002 |

(Continued)

OTHER PUBLICATIONS

Korean Office Action issued by Korean Patent Office on Jun. 27, 2011, corresponding to Korean Patent Application No. 10-2010-0021013 and Request for Entry of the Accompanying Office Action attached herewith.

(Continued)

*Primary Examiner* — Matthew E Warren
(74) *Attorney, Agent, or Firm* — Robert E. Bushnell, Esq.

(57) ABSTRACT

A quantum dot organic light emitting device and a method of manufacturing the same are disclosed. A first electrode layer is formed on a substrate. A block copolymer film which can cause phase separation on the first electrode layer is formed. The block copolymer film is phase-separated into a plurality of first domains, each having a nano size column shape, and a second domain which surrounds the first domains. A quantum dot template film of the second domain, which comprises a plurality of nano size through holes, is formed by selectively removing the first domains. Quantum dot structures, each of which comprises an organic light emitting layer in the through hole of the quantum dot template film, is formed.

17 Claims, 9 Drawing Sheets

(56) References Cited

U.S. PATENT DOCUMENTS

| | | |
|---|---|---|
| 2008/0048571 A1 | 2/2008 | Yoon et al. |
| 2008/0061687 A1 | 3/2008 | Cok et al. |
| 2008/0073743 A1* | 3/2008 | Alizadeh et al. ............... 257/461 |
| 2008/0150423 A1 | 6/2008 | Kim et al. |
| 2008/0180020 A1 | 7/2008 | Cok |
| 2008/0217602 A1 | 9/2008 | Kahen |
| 2008/0237612 A1 | 10/2008 | Cok |
| 2008/0297029 A1 | 12/2008 | Cok |
| 2009/0008628 A1 | 1/2009 | Choi et al. |
| 2009/0239381 A1 | 9/2009 | Nishimi et al. |
| 2009/0266418 A1* | 10/2009 | Hu et al. ....................... 136/260 |
| 2009/0278141 A1 | 11/2009 | Coe-Sullivan et al. |
| 2009/0278445 A1 | 11/2009 | Jen et al. |
| 2010/0032645 A1 | 2/2010 | Choi et al. |
| 2010/0051901 A1 | 3/2010 | Kazlas et al. |
| 2010/0084674 A1 | 4/2010 | Paetzold et al. |
| 2010/0108984 A1 | 5/2010 | Cho et al. |
| 2010/0117110 A1 | 5/2010 | Park et al. |
| 2010/0123699 A1 | 5/2010 | Leon et al. |
| 2011/0168976 A1* | 7/2011 | Mao ............................... 257/13 |

FOREIGN PATENT DOCUMENTS

| | | |
|---|---|---|
| JP | 200345661 A | 2/2003 |
| JP | 2006-055982 A | 3/2006 |
| JP | 2009256592 A | 11/2009 |
| KR | 0642431 | 11/2006 |
| KR | 0665698 | 1/2007 |
| KR | 0721430 | 5/2007 |
| KR | 10-2008-0034542 | 4/2008 |
| KR | 10-2008-0054658 | 6/2008 |
| KR | 1020080093584 A | 10/2008 |
| KR | 10-0868941 B1 | 11/2008 |
| KR | 20080110346 | 12/2008 |
| KR | 1020090087353 A | 8/2009 |

OTHER PUBLICATIONS

Japanese Office Action issued by Japanese Patent Office on Feb. 14, 2012 in the corresponding Japanese Patent Application Serial No. 2010-158159, which also claims Korean Patent Application Serial No. 10-2010-0021013 as its priority document and Request for Entry of the Accompanying Office attached herewith.

Korean Registration Determination Certificate issued by KIPO on Nov. 14, 2011 in the corresponding Korean application No. 2010-0021013.

Japanese Office Action issued by Japanese Patent Office on Jan. 7, 2014 in connection with Japanese Patent Application No. 2012-109987 which also claims Korean Patent Application No. 2010-0021013 as its priority document and Request for Entry of the Accompanying Office Action attached herewith.

* cited by examiner

QUANTUM DOT ORGANIC LIGHT EMITTING DEVICE AND METHOD OF FABRICATING THE SAME

CLAIM OF PRIORITY

This application makes reference to, incorporates the same herein, and claims all benefits accruing under 35 U.S.C. §119 from an application earlier filed in the Korean Intellectual Property Office on the 9 Mar. 2010 and there duly assigned Serial No. 10-2010-0021013.

BACKGROUND OF THE INVENTION

1. Field of the Invention

The present invention relates to an organic light emitting device and, more particularly, to an organic light emitting device having a quantum dot light emitting layer, and a method of fabricating the organic light emitting device.

2. Description of the Related Art

The external quantum efficiency of an organic light emitting device can be expressed by the product of the internal quantum efficiency and the outcoupling efficiency of the organic light emitting device. The internal quantum efficiency of an organic light emitting device depends on the formation probability of emissive excitons. When electrons and holes are recombined, triplet-state excitons and singlet-state excitons are generated in a ratio of 3:1 due to the difference in spin multiplicity of electron spins. Therefore, phosphorescent and fluorescent materials have internal quantum efficiencies of 75% and 25%, respectively.

Phosphorescence is used in a limited manner for manufacturing organic light emitting devices due to its short lifetime, and in most cases, organic light emitting devices are manufactured using fluorescent materials, thereby raising questions regarding the inefficiency of the organic light emitting devices. Therefore, there is a need to develop a nano-scale device that can generate a quantum effect in order to increase the optical efficiency of organic light emitting devices.

SUMMARY OF THE INVENTION

To address the above and/or other problems, the present invention provides a quantum dot organic light emitting device having increased optical efficiency.

The present invention also provides a method of manufacturing a quantum dot organic light emitting device having increased optical efficiency.

According to an aspect of the present invention, there is provided an organic light emitting device comprising: a substrate; a first electrode layer formed on the substrate; a plurality of quantum dot structures, each having an organic light emitting layer on the first electrode layer; and a second electrode layer formed on the quantum dot structures.

Each of the quantum dot structures may have a stack structure in which a hole transport layer, a light emitting layer, an electron transport layer, and a first metal layer are sequentially stacked.

Each of the quantum dot structures may have a stack structure in which a hole injection layer, a hole transport layer, a light emitting layer, an electron transport layer, an electron injection layer, and a first metal layer are sequentially stacked.

According to an aspect of the present invention, a method of manufacturing an organic light emitting device comprises: forming a first electrode layer on a substrate; forming a block copolymer film that can cause phase separation on the first electrode layer; phase-separating the block copolymer film into a plurality of first domains, each having a nano size column shape, and a second domain that surrounds the first domains; forming a quantum dot template film of the second domain which comprises a plurality of nano size through holes by selectively removing the first domains; and forming quantum dot structures, each of which comprises an organic light emitting layer in the through hole of the quantum dot template film.

The block copolymer film may be selected from block copolymers of polystyrene (PS) and polyvinylpyrrolidone (PVP). The phase-separating of the block copolymer film may comprise heating or pressing the block copolymer film. The selective removal of the first domains may comprise irradiating ultraviolet rays or wet etching on the block copolymer film.

The forming of the quantum dot structures may comprise forming a stack structure in which an organic hole transport layer, an organic light emitting layer, an organic electron transport layer, and a first metal layer are sequentially stacked, or may comprise forming a stack structure in which an organic hole injection layer, an organic hole transport layer, an organic light emitting layer, an organic electron transport layer, an organic electron injection layer, and a first metal layer are sequentially stacked.

The forming of the first metal layer may further comprise forming a second electrode layer on the quantum dot structures and the quantum dot template film by extending the first metal layer on the quantum dot template film from the quantum dot structures.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

Figure 1:
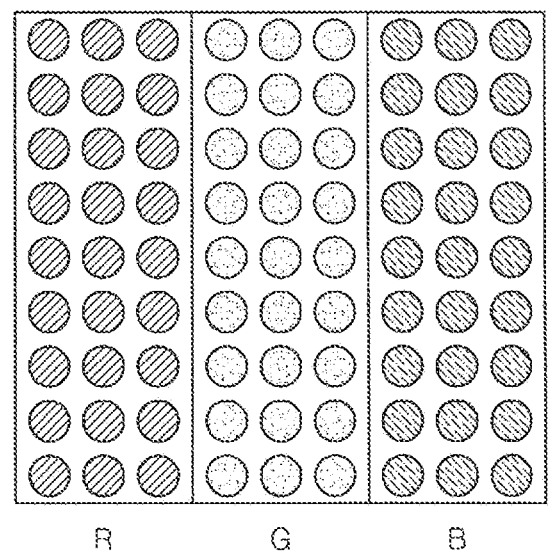
FIG. 1 is a schematic upper view of RGB pixels of a quantum dot organic light emitting device according to an embodiment of the present invention.

FIG. 1 is a schematic upper view of RGB pixels of a quantum dot organic light emitting device according to an embodiment of the present invention.

A conventional organic light emitting device has RGB pixels having a stripe shape.

Referring to FIG. 1, the quantum dot organic light emitting device according to an embodiment of the present invention has RGB pixels, including quantum dots having a size from a few tens to hundreds of nm, and generating a quantum effect.

Figure 2A:
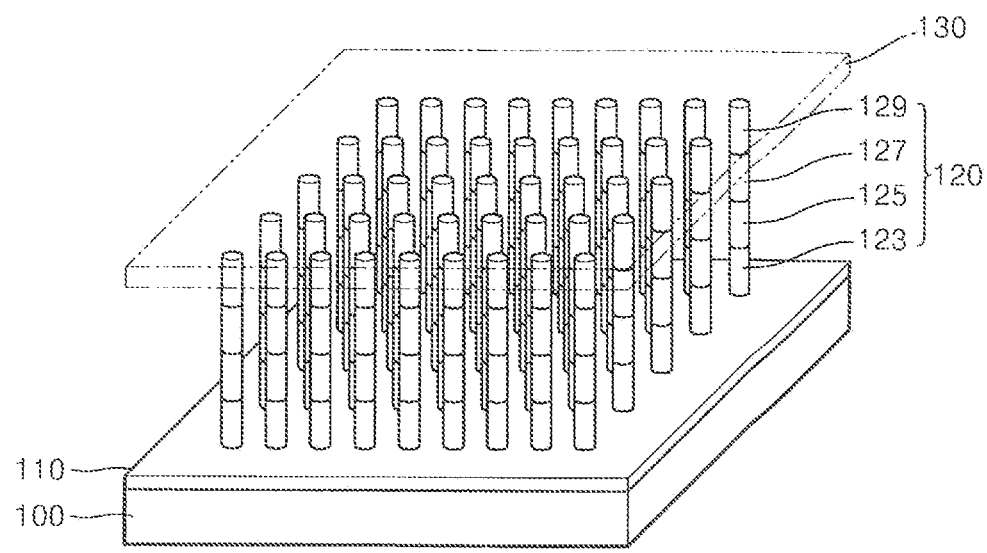
FIGS. 2A and 2B are a schematic perspective view and a cross-sectional view, respectively, of a quantum dot structure of a quantum dot organic light emitting device according to an embodiment of the present invention.
Figure 2B:
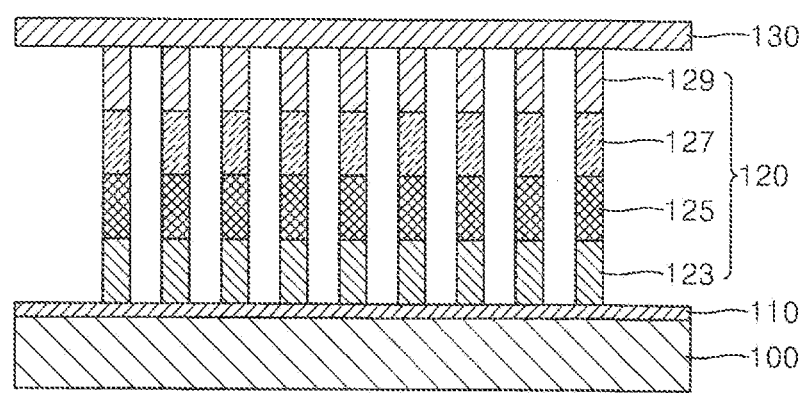

FIGS. 2A and 2B are a schematic perspective view and a cross-sectional view, respectively, of a quantum dot structure of a quantum dot organic light emitting device according to an embodiment of the present invention.

Referring to FIGS. 2A and 2B, a first electrode layer 110 is formed on a substrate 100, and an array of quantum dot structures 120 is formed on the first electrode layer 110. Each of the quantum dot structures 120 includes a plurality of layers 123, 125, 127, and 129. A second electrode layer 130 is formed on the quantum dot structures 120. RGB sub-pixels of the first electrode layer 110 are insulated from each other. However, the second electrode layer 130 having a film shape is common to RGB sub-pixels.

Each of the quantum dot structures 120 may have a diameter of a few tens to hundreds nm that can cause a quantum effect. Each of the quantum dot structures 120 may sequentially include a light emitting layer 125, an electron transport layer 127, and a first metal layer 129 in the quantum dot on a hole transport layer 123 in that order. The sequence of the stacking layers may be reversed, that is, the electron transport layer 127, the light emitting layer 125, and the hole transport layer 123 may be sequentially stacked on the first metal layer 129. In this case, the locations of the first electrode layer 110 and the second electrode layer 130 may be reversed.

The substrate 100 may be transparent, for example, a glass substrate or a plastic substrate. The first electrode layer 110 may be formed of a transparent conductive material such as indium tin oxide (ITO) or zinc oxide (ZnO). The hole transport layer 123, the light emitting layer 125, and the electron transport layer 127 may be formed of an organic material.

The hole transport layer 123 may be formed of 4,4'-bis[N-(1-naphthyl)-N-phenyl-amino]-bi-phenyl (NPD) or N,N-diphenyl-N,N'-bis(3-methyl-phenyl)-1,1'-biphenyl-4,4'-diamine (TPD). The light emitting layer 125 may be formed of a single material of a host or a mixture of a host and a dopant, for example, tris-8-hydroxyquinoline aluminum (Alq3), 4,4'-N,N'-dicarbazole-biphenyl (CBP), or poly(n-vinyl-carbazole (PVK). The election transport layer 127 may be formed of a compound of aryl substituted oxadiazole, aryl substituted triazole, aryl substituted phenanthroline, benzoxazole, or benzoxaizole. The first metal layer 129 may be formed of Al, Ag, Mg, or an alloy of at least two of these metals. The second electrode layer 130 may be formed of the same material as the first metal layer 129. The first electrode layer 110 may function as an anode electrode and the second electrode layer 130 may function as a cathode electrode.

The density of state of the quantum dot greatly differs in bulk semiconductors and planar semiconductors.

Figure 3:
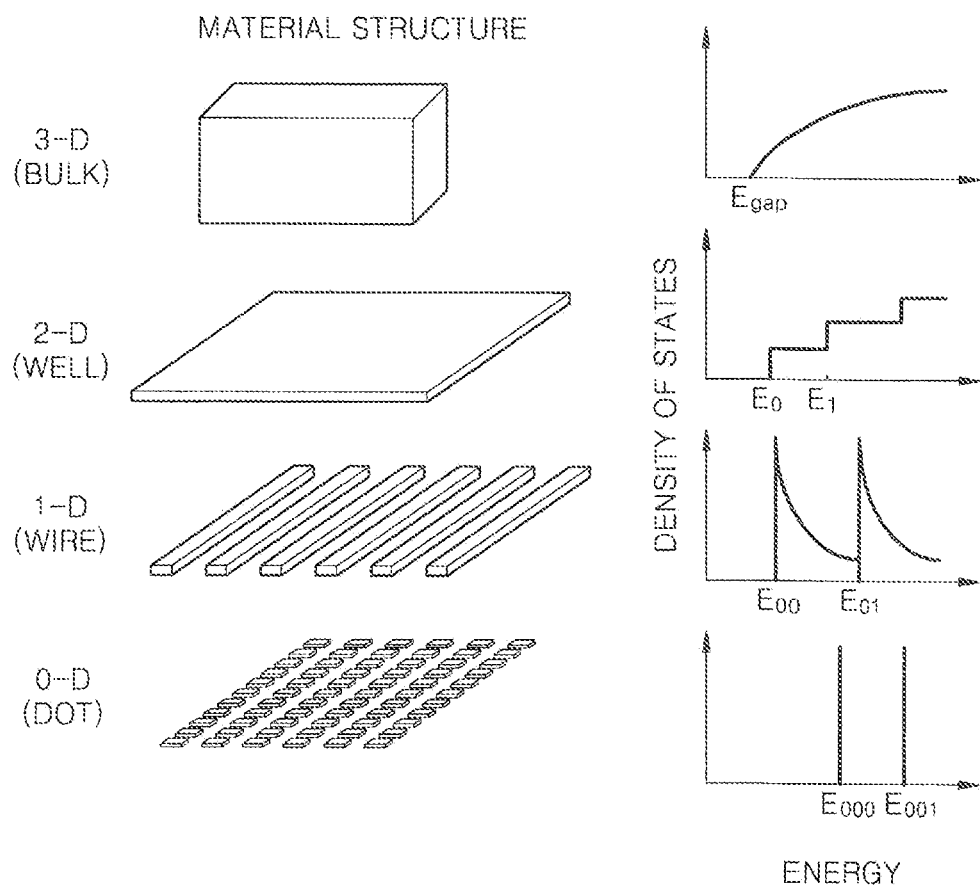
FIG. 3 shows a comparison of density of states of quantum dot in a three-dimensional bulk semiconductor, a two-dimensional planar semiconductor, a one-dimensional wire semiconductor, and a zero-dimensional dot semiconductor.

FIG. 3 shows a comparison of density of states of quantum dot in a three-dimensional bulk semiconductor, a two-dimensional planar semiconductor, a one-dimensional wire semiconductor, and a zero-dimensional dot semiconductor.

The three-dimensional bulk semiconductor has a consecutive density of states. However, the two-dimensional planar semiconductor has a stepwise density of states. When the quantum dot reaches a zero-dimension after going through a one-dimension, the density of states at each of the energy levels within the energy band gap becomes discontinuous, and has a delta function shape.

In this case, carriers such as electrons injected in a non-equivalent state have a very narrow energy band, and thus the emissive quantum efficiency of the carriers rapidly increases compared to the bulk semiconductor case. Also, the maximum optical gain is increased, and thus the threshold current density and the threshold voltage value of a light emitting device can be greatly reduced.

For example, in the case of a semiconductor light emitting diode, the quantum dot has a threshold current density of approximately ¼ of that of a quantum well. The threshold current density of an organic light emitting diode is approximately $10^{-10}$ A/mm$^2$. Therefore, when a quantum dot diode is realized, the threshold current density can be reduced to one-half of that of the organic light emitting diode or even less. Accordingly, the driving voltage can be greatly reduced.

In the case of the quantum dot structure, optical loss can also be reduced, and color purity can be increased due to a narrow light emitting line-width. Accordingly, when the quantum dot structure is used in a top emission type organic light emitting device, an increase in both the internal quantum efficiency and the color purity can be achieved without the need of a resonance structure.

Figure 4A:
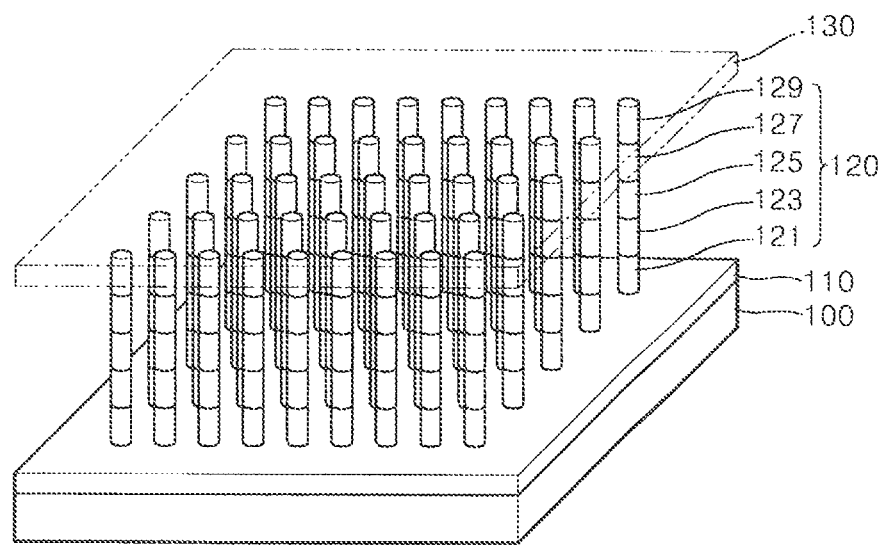
FIGS. 4A and 4B are a schematic perspective view and a cross-sectional view, respectively, of quantum dot structures of a quantum dot organic light emitting device according to another embodiment of the present invention.
Figure 4B:
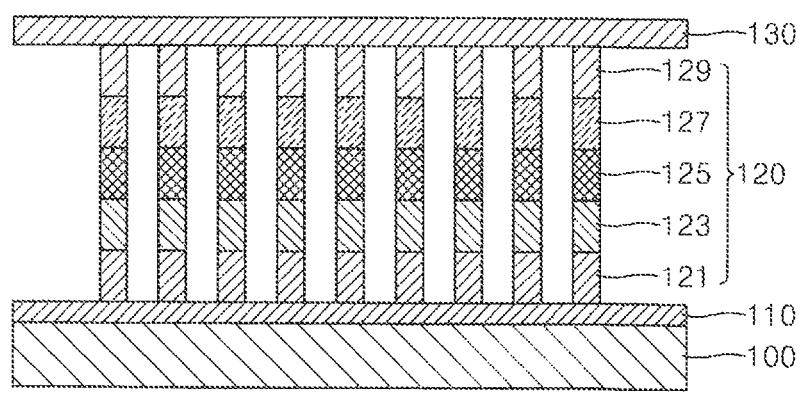

FIGS. 4A and 4B are a schematic perspective view and a cross-sectional view, respectively, of quantum dot structures of a quantum dot organic light emitting device according to another embodiment of the present invention.

The quantum dot structures 120 of the quantum dot organic light emitting device of FIGS. 4A and 4B further includes a second metal layer 121 in the quantum dot, in addition to the quantum dot structures 120 of FIG. 1. The second metal layer 121 may be formed of the same material as the first electrode layer 110. In the quantum dot structures 120, the first metal layer 129, the electron transport layer 127, the light emitting layer 125, and the hole transport layer 123 may be sequentially stacked on the second metal layer 121 in that order. However, the locations of the first electrode layer 110 and the second electrode layer 130 may be reversed.

In the embodiments related to FIGS. 2A and 2B and FIGS. 4A and 4B, the quantum dot structures 120 include the hole transport layer 123, the light emitting layer 125, and the electron transport layer 127, which are formed of an organic material. However, the structures of the organic layers may be modified as necessary. For example, a hole injection layer (not shown) may further be formed between the first electrode layer 110 or the second metal layer 121 and the hole transport layer 123, or an electron injection layer may be formed between the electron transport layer 127 and the first metal layer 129. As other examples, an electron transport layer may be additionally included after the electron transport layer 127 and the light emitting layer 125 are combined into one layer, or a hole transport layer may be additionally included after the electron transport layer 127 and the light emitting layer 125 are combined into one layer.

Figure 5:
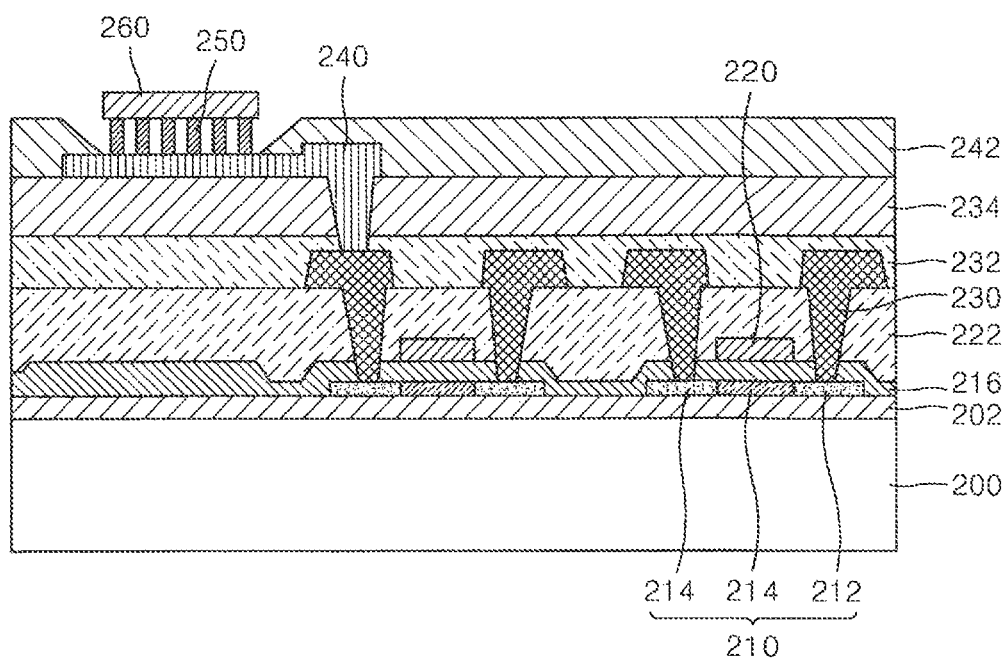
FIG. 5 is a schematic cross-sectional view of a quantum dot organic light emitting device according to an embodiment of the present invention.

FIG. 5 is a schematic cross-sectional view of a quantum dot organic light emitting device according to an embodiment of the present invention.

Referring to FIG. 5, an active layer 210 which includes a channel region 212 and source and drain regions 214 is formed on a buffer layer 202 above a transparent substrate 200. A gate insulating film 216 is formed on the active layer 210, and a gate electrode 220 facing the channel region 212 is formed on the gate insulating film 216. A first interlayer insulating layer 222 is formed on the gate electrode 220 and the gate insulating film 216. Contacts 230 are connected to the source and drain regions 214 through the first interlayer insulating layer 222. A second interlayer insulating layer 232 and a third interlayer insulating layer 234 are formed on the contacts 230 and the first interlayer insulating layer 222. A first electrode 240 is formed on the third interlayer insulating layer 234, and is connected to the contact 230 through the second and third interlayer insulating layers 232 and 234. Quantum dot structures 250 are formed above the first electrode 240.

The quantum dot structures 250, as described with reference to FIG. 1, may include a hole transport layer, a light emitting layer, an electron transport layer, and a first metal layer. Alternatively, a hole injection layer and an electron injection layer may further be respectively included between the first electrode layer and the hole transport layer and between the first metal layer and the electron transport layer. Also, alternatively, the electron transport layer may be additionally included after the hole transport layer and the light emitting layer are combined into one layer, or the hole transport layer may be additionally included after the hole transport layer and the light emitting layer are combined into one layer. A second electrode 260 is formed on the quantum dot structures 250.

In FIG. 5, a bottom emission type organic light emitting device, in which light generated from light emitting layers of the quantum dot structures 250 is emitted through a lower side of the substrate 200, is described. However, the present invention can also be applied to a top emission type organic light emitting device in which light generated from light emitting layers of the quantum dot structures 250 is emitted through an upper side of the substrate 200. Also, the structure of the gate electrode is not limited to the inverted staggered type shown in FIG. 5. That is, the gate electrode may have various structures such as a staggered type, a coplanar type, or an inverted coplanar type.

Figure 6:
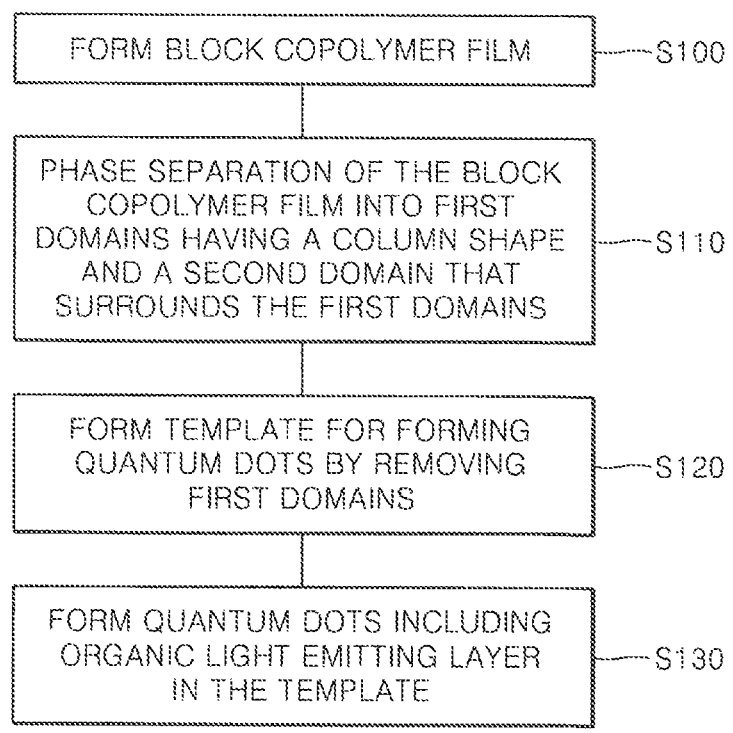
FIG. 6 is a block diagram showing a method of manufacturing a quantum dot structure of a quantum dot organic light emitting device according to an embodiment of the present invention.

FIG. 6 is a block diagram showing a method of manufacturing the quantum dot structures of a quantum dot organic light emitting device according to an embodiment of the present invention.

A block copolymer film which includes first and second polymers, phases of which can be separated, is formed on a substrate (S100). The block copolymer film may be formed by coating a solution, which is made by dissolving a block copolymer in an appropriate solvent, by using a spin coating method.

Next, the block copolymer film is phase-separated into first domains having a column shape and a second domain which surrounds the first domains, which are regularly repeated, by heating or applying a pressure to the block copolymer film (S110). The first domains may be formed of a first polymer, and the second domain may be formed of a second polymer. The first domains having a column shape and the second domain which surrounds the first domains form a nano scale structure which is regularly repeated.

In a block copolymer, at least two polymers having characteristics different from each other are connected through a covalent bond. Therefore, the block copolymer film can form a periodical nano scale structure by being phase-separated when a predetermined temperature or a pressure is applied to the block copolymer film. The size and shape of domains of nano scale structure formed by phase separation may vary according to the length and relative amount of each of the polymers.

Next, a template for forming quantum dot structures is formed by selectively removing the first domains having a column shape from the phase-separated block copolymer (S120) by irradiating ultraviolet rays thereto or by using a wet etching method. When the first domains having a column shape are removed, a quantum dot template film consisting of second domains, each having a nano scale through hole is formed.

Next, quantum dots, each of which includes an organic light emitting layer in the through hole of the quantum dot template film, are formed (S130). An organic layer stack and a first metal layer can be sequentially formed in the through hole. The organic layer stack may have various stack structures as necessary—for example, a stack structure in which a hole transport layer, an organic light emitting layer, and an electron transport layer are sequentially stacked; a stack structure in which a hole injection layer, a hole transport layer, an organic light emitting layer, an electron transport layer, and an electron injection layer are sequentially stacked; a stack structure in which a hole transport layer and an organic light emitting layer are sequentially stacked; or a stack structure in which an organic light emitting layer and an electron transport layer are sequentially stacked. The hole transport layer and the electron transport layer may also be formed of an organic material.

FIGS. 7A thru 7E are schematic perspective views showing a method of manufacturing a quantum dot structure of a quantum dot organic light emitting device according to an embodiment of the present invention.

Figure 7A:
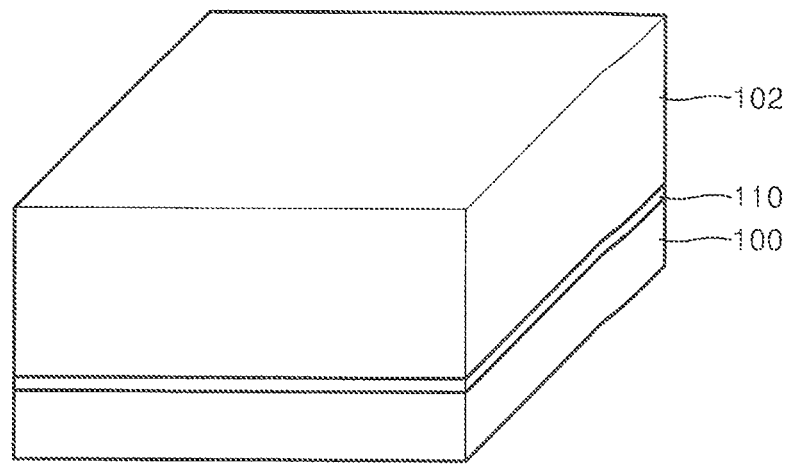
FIGS. 7A thru 7E are schematic perspective views showing a method of manufacturing a quantum dot structure of a quantum dot organic light emitting device according to an embodiment of the present invention.

Referring to FIG. 7A, a first electrode layer 110 is formed on a transparent substrate 100 formed of glass or plastic. A block copolymer film 102 containing polystyrene (PS) and polyvinylpyrrolidone (PVP) is formed on the first electrode layer 110. The block copolymer film 102 can be formed by coating a solution which is made by dissolving PS and PVP in an appropriate solvent such as chloroform, toluene, dichlorobenzene, or tetrahydrofuran (THF). When the block copolymer film 102 is formed, the composition ratio of PVP and PS is controlled so that a PS domain having a column shape and a PVP domain which surrounds the PS domain can be formed when the block copolymer film 102 is phase-separated. The composition ratio of PS:PVP may be 1:1~1:10.

Figure 7B:
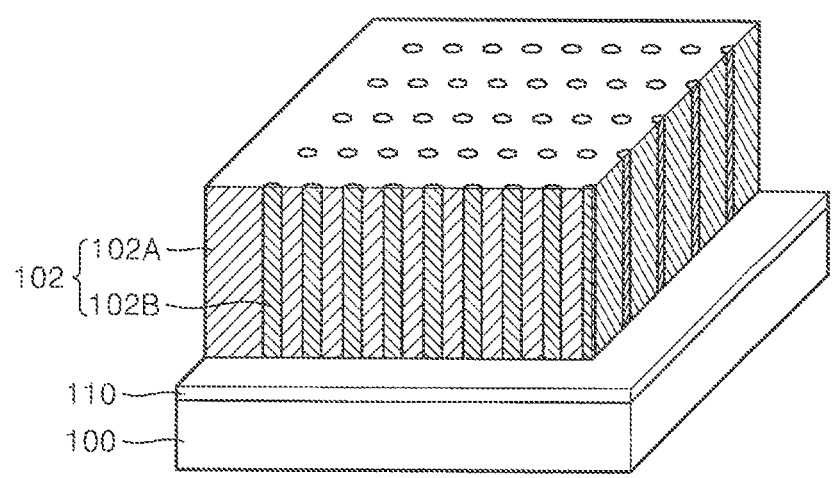

Referring to FIG. 7B, when the block copolymer film 102 is heated or pressed, the block copolymer film 102 is divided into a PS domain 102E having a nano column shape and a PVP domain 102A which surround the PS domain 102B by phase separation.

Figure 7C:
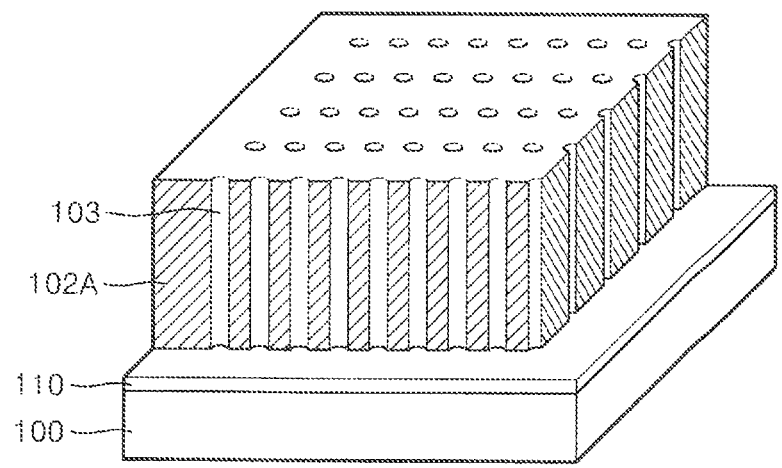

Referring to FIG. 7C, the PS domain 102B of FIG. 7B having a nano column shape is selectively removed by irradiating ultraviolet rays thereto or by using a wet etching method. When the PS domain 102B is removed, a template of the PVP domain 102A for forming quantum dot structures having a regular array of through holes 103 is formed.

Figure 7D:
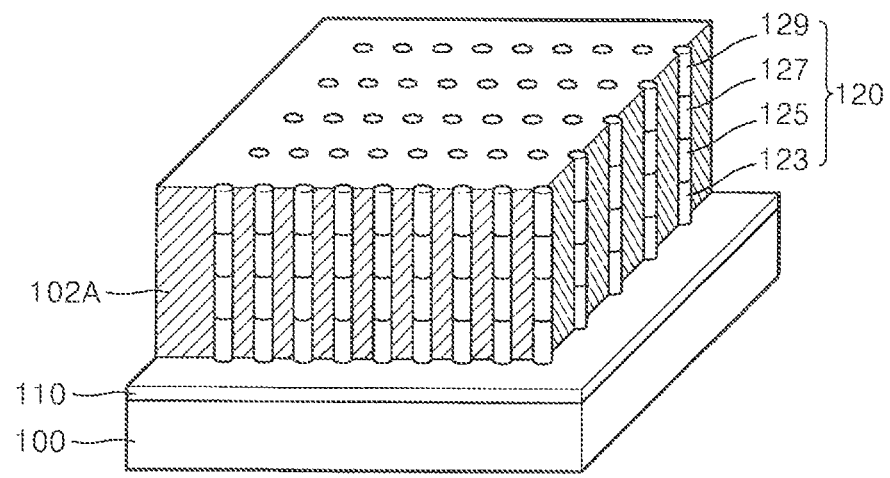
Figure 7E:
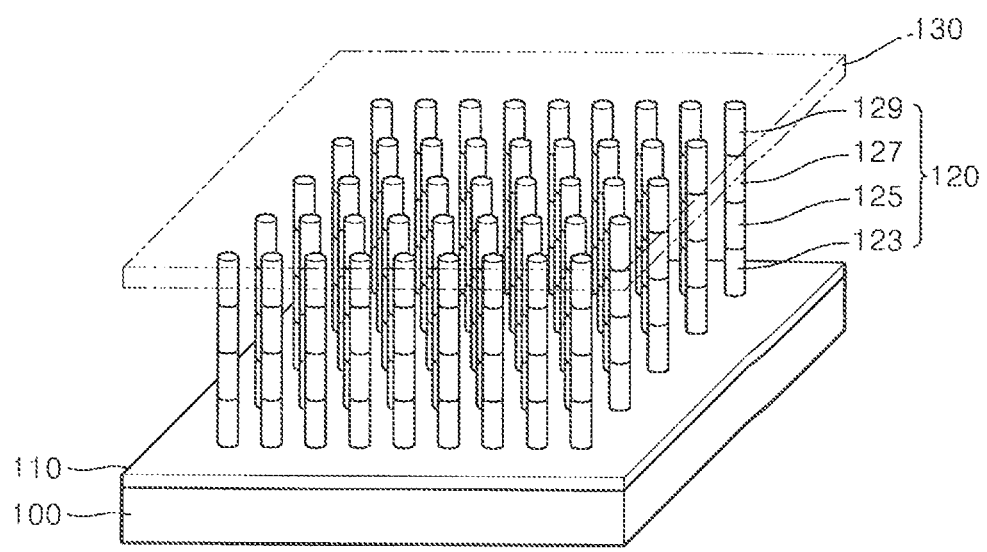

Referring to FIG. 7D, a hole transport layer 123, a light emitting layer 125, and an electron transport layer 127 are sequentially formed in each of the through holes 103 of the template of FIG. 7C. Each of the layers may be formed by using various deposition methods. Next, a first metal layer 129 is formed on the electron transport layer 127. Although not shown in FIG. 7D, the first metal layer 129 may be formed to fill remaining spaces of the through holes 103 on the electron transport layer 127, and to form a film (a second electrode layer 130 in FIG. 7E) having a predetermined thickness on a surface of the template as shown in FIG. 7E. Since the second electrode layer 130 and the first metal layer 129 are formed in one unit, the structural strength of the quantum dot structures 120 can be increased.

Materials for forming each of the layers will now be described. The first electrode layer 110 may be formed of a transparent conductive material such as ITO or ZnO. The hole transport layer 123 may be formed of NPD or TPD. The light emitting layer 125 may be formed of various materials, that is, a single material or a mixture of a host and a dopant, for example, Alq3, CBP, or PVK. The electron transport layer 127 may be formed of, for example, a compound of aryl substituted oxadiazole, aryl substituted triazole, aryl substituted phenanthroline, benzoxazole, or benzoxaizole. The first metal layer 129 may be formed of Al, Ag, Mg, or an alloy of at least two of these metals.

Referring to FIG. 7E, the template is selectively removed so as to maintain the quantum dot structures 120. Although not shown, an insulating film (not shown) which surrounds the quantum dot structures 120 may further be formed after the template is removed. The template can also be used as an insulating film without removing it.

According to the present invention, since the organic light emitting layer is formed so as to have quantum dot structures, the optical efficiency of the organic light emitting device can be increased. Also, a template is formed by using phase separation of a block copolymer, and thus reliable quantum dot structures can be formed.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of manufacturing an organic light emitting device, the method comprising the steps of:
   forming a first electrode layer on a substrate;
   forming a block copolymer film which causes phase separation on the first electrode layer;
   phase-separating the block copolymer film into a plurality of first domains, each having a nano size column shape, and a second domain which surrounds the first domains;
   forming a quantum dot template film of the second domain which comprises a plurality of nano size through holes by selectively removing the first domains; and
   forming quantum dot structures, each of which comprises an organic light emitting layer in the through hole of the quantum dot template film.

2. The method of claim 1, wherein the block copolymer film is selected from block copolymers of polystyrene (PS) and polyvinylpyrrolidone (PVP).

3. The method of claim 1, wherein the first domains are polystyrene (PS) and the second domain is polyvinylpyrrolidone (PVP).

4. The method of claim 1, wherein the step of phase-separating the block copolymer film comprises one of heating and pressing the block copolymer film.

5. The method of claim 1, wherein the selective removal of the first domains comprises one of irradiating ultraviolet rays thereto and wet etching on the block copolymer film.

6. The method of claim 1, wherein the step of forming the quantum dot structures comprises forming a stack structure in which an organic hole transport layer, an organic light emitting layer, an organic electron transport layer, and a first metal layer are sequentially stacked.

7. The method of claim 1, wherein the step of forming of quantum dot structures comprises forming a stack structure in which an organic hole injection layer, an organic hole transport layer, an organic light emitting layer, an organic electron transport layer, an organic electron injection layer, and a first metal layer are sequentially stacked.

8. The method of claim 7, wherein the organic light emitting layer is formed of one of Alq3, CBP, and PVK.

9. The method of claim 7, wherein the first electrode layer is formed of one of indium tin oxide (ITO) and zinc oxide (ZnO).

10. The method of claim 7, wherein the first metal layer is formed of one of Al, Ag, Mg, and an alloy of these metals.

11. The method of claim 7, wherein the step of forming the first metal layer further comprises forming a second electrode layer on the quantum dot structures and the quantum dot template film by extending the first metal layer on the quantum dot template film from the quantum dot structures.

12. The method of claim 6, wherein the organic light emitting layer is formed of one of Alq3, CBP, and PVK.

13. The method of claim 6, wherein the first electrode layer is formed of one of indium tin oxide (ITO) and zinc oxide (ZnO).

14. The method of claim 6, wherein the first metal layer is formed of one of Al, Ag, Mg, and an alloy of these metals.

15. The method of claim 6, wherein the step of forming the first metal layer further comprises forming a second electrode layer on the quantum dot structures and the quantum dot template film by extending the first metal layer on the quantum dot template film from the quantum dot structures.

16. The method of claim 1, further comprising the step of selectively removing the quantum dot template film and forming an insulating film which surrounds the quantum dot structures.

17. The method of claim 1, wherein each of the quantum dot structures has a diameter in a range of few tens to hundreds of nm.

* * * * *